US009584131B2

(12) United States Patent
Kojima et al.

(10) Patent No.: US 9,584,131 B2
(45) Date of Patent: Feb. 28, 2017

(54) PROGRAMMABLE DEVICE, INFORMATION PROCESSING DEVICE, AND CONTROL METHOD FOR PROCESSING CIRCUIT OF PROGRAMMABLE DEVICE

(71) Applicant: Sony Interactive Entertainment Inc., Tokyo (JP)

(72) Inventors: Takahisa Kojima, Tokyo (JP); Masashi Endo, Saitama (JP); Takashi Akai, Tokyo (JP); Hideki Hara, Tokyo (JP)

(73) Assignees: Sony Corporation, Tokyo (JP); Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 15/130,424

(22) Filed: Apr. 15, 2016

(65) Prior Publication Data

US 2016/0322973 A1  Nov. 3, 2016

(30) Foreign Application Priority Data

Apr. 28, 2015  (JP) ................................. 2015-092317

(51) Int. Cl.
*G06F 7/38* (2006.01)
*H03K 19/173* (2006.01)
*H03K 19/177* (2006.01)

(52) U.S. Cl.
CPC ... *H03K 19/1776* (2013.01); *H03K 19/17764* (2013.01)

(58) Field of Classification Search
None
See application file for complete search history.

(56) References Cited

U.S. PATENT DOCUMENTS 9,342,407 B2 * 5/2016 Ogasawara ......... G06F 11/0721
2007/0050689 A1 * 3/2007 Sasakura .......... G01R 31/31816
714/718

FOREIGN PATENT DOCUMENTS

JP  2011216020  10/2011

* cited by examiner

*Primary Examiner* — Anh Tran
(74) *Attorney, Agent, or Firm* — Matthew B. Dernier, Esq.

(57) ABSTRACT

A programmable device is disclosed which includes: a circuit data setting section configured to set a logical configuration in a processing circuit using first setting information retrieved from a memory; and a communication status monitoring section configured to determine whether communication is established between the processing circuit and a host computer using the setting made by the circuit data setting section. If it is determined that the communication is not established, the circuit data setting section retrieves from the memory second setting information different from the first setting information to again set a logical configuration in the processing circuit on the basis of the second setting information.

6 Claims, 4 Drawing Sheets

PROGRAMMABLE DEVICE, INFORMATION PROCESSING DEVICE, AND CONTROL METHOD FOR PROCESSING CIRCUIT OF PROGRAMMABLE DEVICE

BACKGROUND

The present disclosure relates to technology for controlling a circuit configuration of a programmable device.

Recent years have witnessed the widespread use of programmable logic devices (PLD) such as a field programmable gate array (FPGA) and a complex programmable logic device (CPLD) of which the circuit configuration can be defined by users. These devices allow their circuit logical configuration to be changed not only at the time of shipment but also after they have started operating. The PLD thus has broader utility than existing devices whose operations are fixed. The PLD is also effective in lowering the costs involved including the cost of development.

The PLD has the characteristic of allowing its circuits to be appropriately reconfigured to overcome a malfunction that may occur. In view of this, techniques have been proposed to perform self-diagnosis for malfunctions and reconfigure relevant circuits as needed. These techniques provide, for example, redundant circuits that may be arranged to reconfigure the defective processing circuit into the same state as that of a normally operating processing circuit (e.g., see Japanese Patent Laid-open No. 2011-216020).

SUMMARY

If a malfunction occurs during operation of a system having the PLD, it may not be clear what has caused the PLD to fail. In such a case, the above-mentioned automatic reconfiguration may not be sufficient to deal with the failure. Ultimately, the administrator of the system, for example, may verify the circuits involved and analyze and correct the data defining the circuit configuration. Meanwhile, the circuit configuration of the PLD in operation of the system may be often updated by taking advantage of the above-mentioned characteristics of the PLD. If such an update has resulted in a malfunction, competent personnel such as the system administrator may visit the installation site and perform corrective work such as removal and repair of substrates on the site, which can involve enormous effort.

The present disclosure has been made in view of the above circumstances. It is desirable to provide techniques for easily correcting a failure in a system having a programmable device.

According to one embodiment of the present disclosure, there is provided a programmable device including: a circuit data setting section configured to set a logical configuration in a processing circuit using first setting information retrieved from a memory; and a communication status monitoring section configured to determine whether communication is established between the processing circuit and a host computer using the setting made by the circuit data setting section. If it is determined that the communication is not established, the circuit data setting section retrieves from the memory second setting information different from the first setting information to again set a logical configuration in the processing circuit on the basis of the second setting information.

According to another embodiment of the present disclosure, there is provided an information processing device including: a programmable device configured to include a circuit data setting section setting a logical configuration in a processing circuit using first setting information retrieved from a memory; and a communication status monitoring section configured to determine whether communication is established between the processing circuit and a host computer using the setting made by the circuit data setting section. If it is determined that the communication is not established, the communication status monitoring section notifies the circuit data setting section of the result of the determination. Given the notification, the circuit data setting section retrieves from the memory second setting information different from the first setting information to again set a logical configuration in the processing circuit on the basis of the second setting information.

According to a further embodiment of the present disclosure, there is provided a control method for a processing circuit of a programmable device, the method including: setting a logical configuration in the processing circuit using first setting information retrieved from a memory; determining whether communication is established between the processing circuit and a host computer using the setting; and if it is determined that the communication is not established, then retrieving from the memory second setting information different from the first setting information to again set a logical configuration in the processing circuit on the basis of the second setting information.

Where other combinations of the above-outlined composing elements or the above expressions of the present disclosure are converted between different forms such as a method, a device, a system, a computer program, and a recording medium that records a computer program, they still constitute effective embodiments of this disclosure.

According to the present disclosure, a failure occurring in the system having the programmable device can be easily corrected.

DETAILED DESCRIPTION OF THE PREFERRED EMBODIMENT

Figure 1:
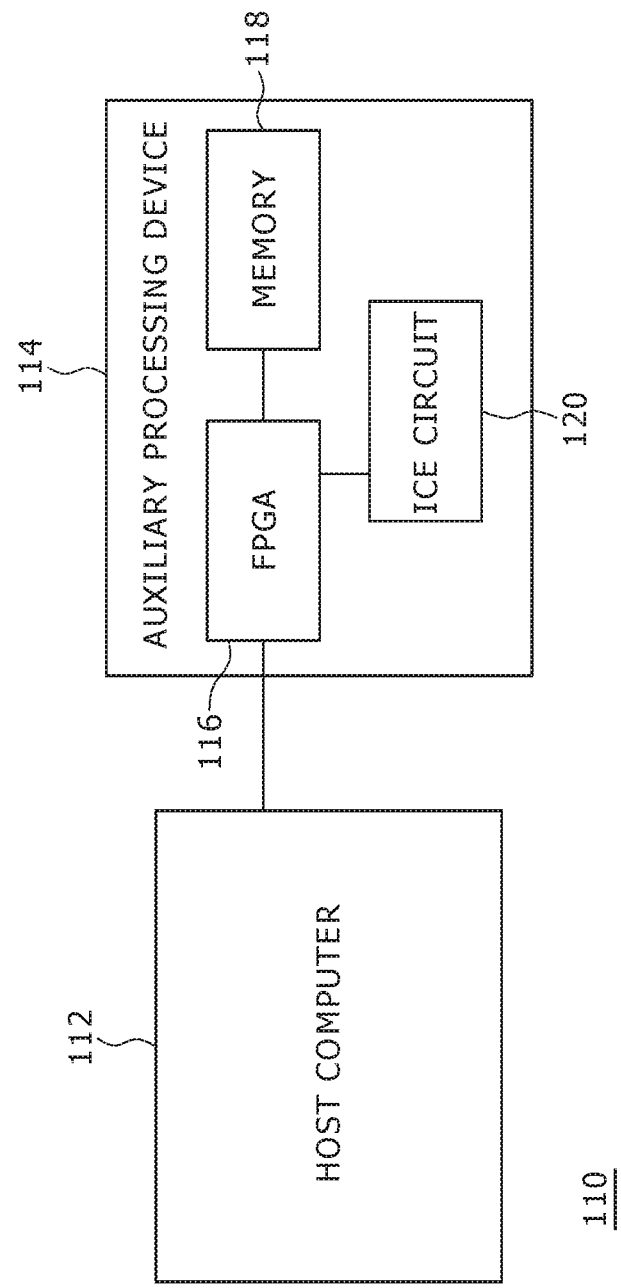
FIG. 1 is a schematic diagram depicting a typical structure of an ordinary information processing system that uses a PLD.

To clarify the features of one embodiment of the present disclosure, how the PLD is operated by existing techniques is described first. FIG. 1 depicts a typical structure of an ordinary information processing system that uses a PLD. Although the ensuing description will focus on the FPGA as an example of the PLD, the embodiment is not limited to the FPGA. An information processing system 110 includes a host computer 112 and an auxiliary processing device 114.

The auxiliary processing device 114 basically performs processes as requested by the host computer 112 and returns the result of the processing to the host computer 112. For example, a plurality of information processing systems 110 may be combined to make up servers of a data center that provides cloud services, with the auxiliary processing device 114 searching for data requested by the host computer 112. In this setup, the auxiliary processing device 114 is further connected with external storage devices that store the data to be searched. The auxiliary processing device 114 is also capable of other diverse processes including data encryption and image recognition, the execution of which may be made by further external devices, not depicted.

The specifics of the processes performed by the auxiliary processing device 114, which acts as an accelerator for the host computer 112, may be anything that is currently practicable. The auxiliary processing device 114 includes an FPGA 116, a memory 118, and an in-circuit emulator (ICE) circuit 120. The memory 118 is a nonvolatile memory such as a read-only memory (ROM) or a flash memory that holds setting information for setting a desired circuit configuration in the FPGA 116 (the information will be referred to as "circuit data" hereunder). Turning on the auxiliary processing device 114 causes the circuit data to be read from the memory 118. The retrieved circuit data is transferred and written to the FPGA 116 where logic circuits are configured. This process will be referred to as "configuration" hereunder.

When all circuit data has been written and successfully configured, the FPGA 116 establishes communication with the host computer 112 in accordance with relevant settings. The FPGA 116 starts to operate in response to requests from the host computer 112. If the configuration is unsuccessful typically because of incomplete writing of the circuit data, the FPGA 116 obviously fails to function normally. Preparatory to such an eventuality, the FPGA 116 is designed beforehand to detect the malfunction and ensure minimum functionality by retrieving backup circuit data from the memory 118 for reconfiguration purposes.

The backup circuit data is basic information stored in a write-protected area of the memory 118 typically at the time of shipment of the FPGA 116. In many cases, the backup circuit data is different from the circuit data set by the user for the intended purpose. The user-set circuit data, if configured unsuccessfully, may be corrected in order to achieve the intended purpose of the auxiliary processing device 114 in the information processing system 110. As long as the backup circuit data enables the FPGA 116 to communicate with the host computer 112, the circuit data can be corrected by accessing the memory 118 from an external computer, not depicted, through the host computer 112.

One advantage of using the FPGA 116 in such a system is that the circuit configuration may be updated arbitrarily depending on the situation. That is, updating the circuit data set by the user in the memory 118 optimizes the circuit configuration in keeping with the connection environment in the vicinity and in accordance with the program updates performed by the host computer 112, for example. The circuit data can be updated typically by accessing the memory 118 from the external computer through communication between the host computer 112 and the FPGA 116. However, the circuit data may or may not be updated correctly in this manner. Incorrectly updated circuit data can cause the FPGA 116 to malfunction next time power is applied in order to perform configuration accordingly, for example.

If the configuration fails in the above manner, minimum functionality is ensured by configuring the circuits with the backup circuit data. On the other hand, it might happen that although the FPGA 116 has its circuits configured, it fails to communicate with the host computer 112 for some reason. One cause of the failed communication may be defective communication-related data in the circuit data. Another cause of the communication failure may be the updated data which is not directly related to communication but which may have affected communication in an unexpected manner.

In some cases, the availability of communication may depend on the host computer 112 in terms of inter-device compatibility, cable conditions, and installation environment. Thus, the FPGA 116 itself may be operable but unable to establish communication with the host computer 112. The lack of communication with the host computer 112 prevents the auxiliary processing device 114 from performing its intended purpose. This also inhibits the circuit data in the FPGA 116 from being corrected by access from the outside. In such a case, the system administrator may visit the installation site of the auxiliary processing device 114 and perform corrective work on the site, such as connecting the FPGA 116 with a computer, not depicted, via the ICE circuit 120 so as to analyze operations and correct the circuit data stored in the memory 118.

Figure 2:
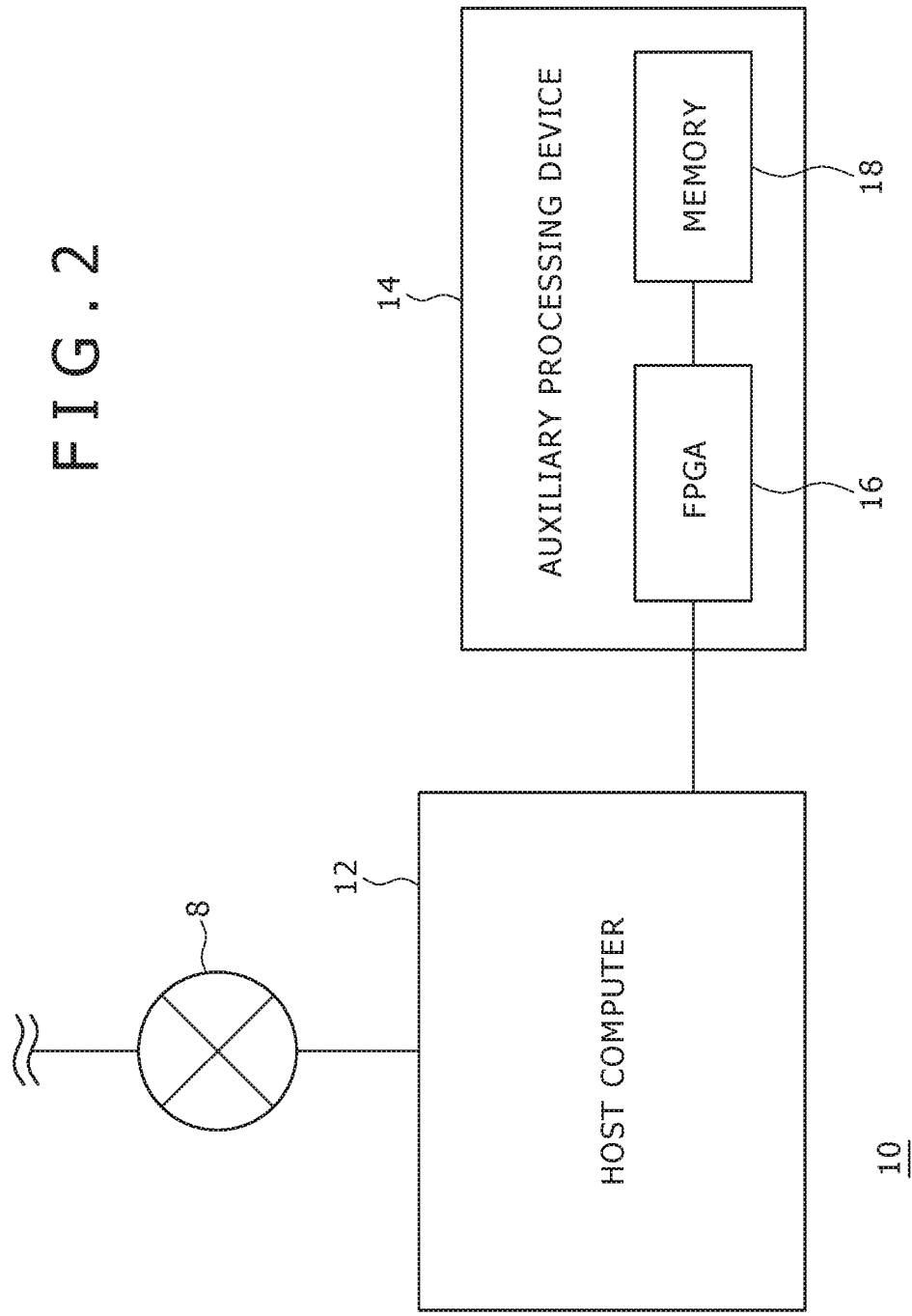
FIG. 2 is a schematic diagram depicting a typical structure of an information processing system to which an embodiment of the present disclosure is adapted.

The possibility to perform such work on the above-described complex problem can arise more frequently the larger the number of times updates are performed and the larger the number of installation sites involved. The inventors took notice of this situation and have come up with techniques for easily overcoming the problem regardless of the nature of the malfunction. What follows is a description of one embodiment of the techniques devised by the inventors. FIG. 2 depicts a typical structure of an information processing system to which one embodiment of the present disclosure is adapted. An information processing system 10 in the embodiment includes a host computer 12 and an auxiliary processing device 14. The basic functions of the host computer 12 and the auxiliary processing device 14 are substantially the same as those of the host computer 112 and the auxiliary processing device 114 in the ordinary information processing system 110 depicted in FIG. 1.

That is, the auxiliary processing device 14 performs processes as requested by the host computer 12 and returns the result of the processing to the host computer 12. The overall purpose of the system is not limited to anything specifically defined. The host computer 12 is connected to a network 8 that permits connection with an external computer, not depicted. In the embodiment, the circuit data, if found defective, is corrected basically by accessing the auxiliary processing device 14 from the external computer via the network 8 and host computer 12.

Like the auxiliary processing device 114 in FIG. 1, the auxiliary processing device 14 is thus provided with an FPGA 16 and a memory 18 but has no need for an ICE circuit for direct access to the FPGA 16. However, the structure of the auxiliary processing device 14 is not limited to what is explained here. The configuration of the internal circuits may be varied depending on the purpose of the auxiliary processing device 14 and on the functions assigned to the FPGA 16. Also, external storage devices may be additionally connected to the auxiliary processing device 14 as discussed above.

Figure 3:
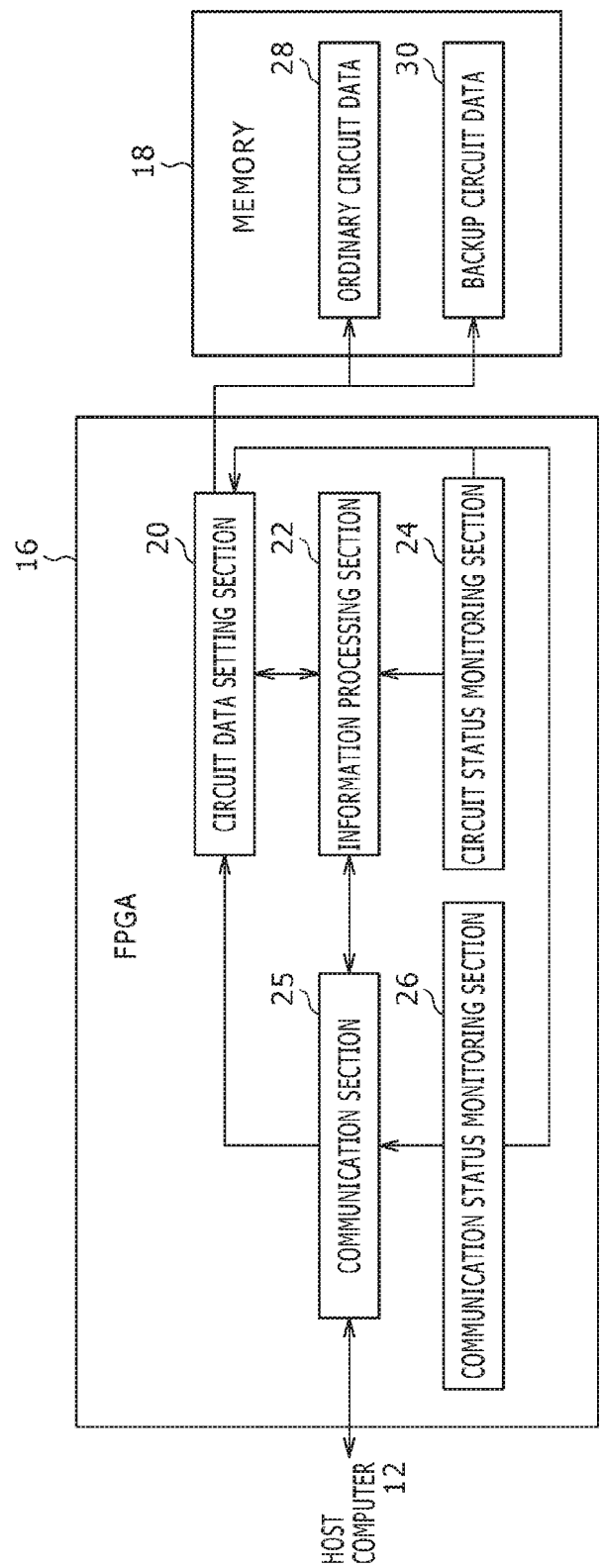
FIG. 3 is a schematic diagram depicting a structure of functional blocks of a FPGA and a structure of data stored in a memory in the embodiment.

FIG. 3 depicts a structure of the functional blocks of the FPGA 16 and a structure of the data stored in the memory 18 in the embodiment. The FPGA 16 includes a circuit data setting section 20, an information processing section 22, a circuit status monitoring section 24, a communication section 25, and a communication status monitoring section 26. The memory 18 stores ordinary circuit data 28 and backup circuit data 30. The circuit data setting section 20 configures logic circuits in the FPGA 16 by accessing the memory 18 and retrieving the ordinary circuit data 28 or the backup circuit data 30 therefrom to perform configuration. The circuit data setting section 20 further provides an interface that allows the memory 18 to be accessed from the host computer 12 or from an external computer via the host computer 12.

The information processing section 22 is constituted by a processing circuit whose logical configuration is set on the basis of the ordinary circuit data 28 or the backup circuit data 30 retrieved by the circuit data setting section 20. The information processing section 22 performs processes in accordance with the content of the circuit data and in response to requests from the host computer 12. The circuit status monitoring section 24 monitors whether the configuration of the logic circuits is complete. Whether the logic circuit configuration is complete is determined by known techniques, such as by checking a cyclic redundancy check (CRC) value calculated with a CRC circuit in the FPGA 16 against the correct CRC value for a match.

The state in which "the logic circuit configuration is complete" and which can be detected by such known techniques described above means this: that all settings included in the ordinary circuit data 28 are reflected in the circuits constituting the information processing section 22. It should be noted that that state may or may not be conducive to performing the intended operation. If the logic circuits are not configured normally, the circuit status monitoring section 24 notifies the circuit data setting section 20 of that effect.

The communication section 25 is an interface that establishes communication with the host computer 12 in accordance with a predetermined protocol such as peripheral component interconnect (PCI) or PCI Express. The communication status monitoring section 26 monitors whether communication is normally established with the host computer 12. If the communication is not established, the communication status monitoring section 26 notifies the circuit data setting section 20 of that effect. Whether the communication is established is determined by the technique relevant to the communication protocol in use. For example, the determination can be made by checking whether a communication establishment signal is transmitted within a predetermined time after the auxiliary processing device 14 is switched on, whether a communication error message is transmitted, or whether the auxiliary processing device 14 is accessed from the host computer 12 within the predetermined time period.

The ordinary circuit data 28 stored in the memory 18 is the circuit data to be set in the FPGA 16 so as to let the auxiliary processing device 14 exert the desired function. The ordinary circuit data 28, prepared typically at the time of system construction, can be updated after the start of operation depending on the situation. The ordinary circuit data 28 is stored in a rewritable area of the memory 18. The backup circuit data 30, retrieved typically when the ordinary circuit data 28 has failed, guarantees normal operations including at least the establishment of communication. The backup circuit data 30 is stored basically in a write-protected area of the memory 18.

Figure 4:
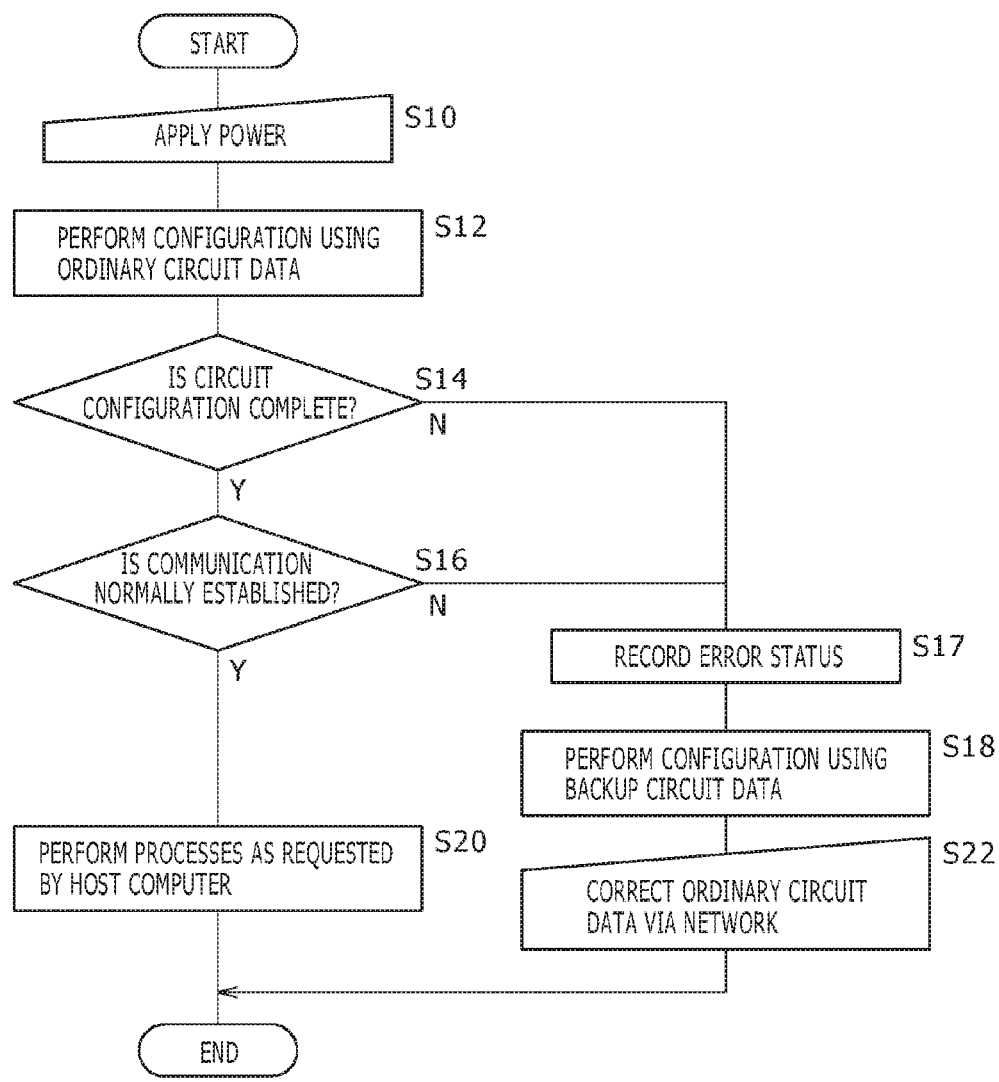
FIG. 4 is a flowchart of processes beginning with the process of starting an auxiliary processing device in the embodiment.

Explained below is the operation of the auxiliary processing device 14 implemented with the structure described above. FIG. 4 is a flowchart of processes carried out when the auxiliary processing device 14 in the embodiment is started. First, the auxiliary processing device 14 is switched on (S10). This causes the circuit data setting section 20 to read the ordinary circuit data 28 from the memory 18 to perform configuration (S12). Specifically, processes such as the initialization and synchronization of an internal memory, verification of the target circuits, and retrieval of the ordinary circuit data 28 are performed at this point substantially in the same manner as in an ordinary configuration procedure. The circuit status monitoring section 24 then determines whether the configuration of the logic circuits is complete (S14).

If it is determined that the logic circuit configuration is incomplete (N in S14), the circuit status monitoring section 24 generates an error signal and sends it to the circuit data setting section 20. This causes the circuit data setting section 20 to record, in a predetermined storage area, the incomplete logic circuit configuration as the error status (S17). The circuit data setting section 20 proceeds to read the backup circuit data 30 from the memory 18 to perform configuration (S18). The location to which the error status is recorded is not limited to within the memory 18. That location may alternatively be in another memory inside the auxiliary processing device 14 or in an external memory, as long as the memory can be accessed from an external computer following the configuration using the backup circuit data 30. As another alternative, the error status may be recorded by the circuit status monitoring section 24. On the other hand, if it is determined that the configuration of the logic circuits is complete (Y in S14), the communication status monitoring section 26 determines whether communication is normally established with the host computer 12 (S16).

If it is determined that the communication is not established normally (N in S16), the communication status monitoring section 26 generates an error signal and sends it to the circuit data setting section 20. This causes the circuit data setting section 20 to record, in the above-mentioned predetermined storage area, the failed attempt to establish communication as the error status (S17). The circuit data setting section 20 proceeds to read the backup circuit data 30 from the memory 18 to perform configuration (S18). Alternatively, the error status may be recorded by the communication status monitoring section 26. Although the flowchart in FIG. 4 depicts that whether communication is established is determined in S16 only after the circuit configuration is found complete in S14, this is not limitative of the present disclosure. In practice, the communication status monitoring section 26 may monitor the establishment of communication independently of the monitoring by the circuit status monitoring section 24. In any case, two points are to be checked: the configuration of the circuits, and the establishment of communication. If at least one of these two points is determined to have developed an error, the backup circuit data 30 is retrieved for reconfiguration.

If the configuration using the ordinary circuit data 28 is determined to be free of errors (Y in S16), the information processing section 22 can accomplish the intended process set by the ordinary circuit data 28. The information processing section 22 thus acquires requests from the host computer 12 via the communication section 25 and performs processes as requested thereby (S20). On the other hand, if the incomplete circuit configuration or the failed attempt to establish communication has necessitated reconfiguration using the backup circuit data 30 (S18), competent personnel such as the system administrator correct the ordinary circuit data 28 in the memory 18 as needed from the external computer by way of the host computer 12, the communication section 25, and circuit data setting section 20 (S22). At this point, referencing the error status recorded in S17 facilitates corrective work. Depending on how the interface is structured, the access to the memory 18 from the external computer may not require the intervention of the FPGA 16.

As with the information processing section 22, the communication status monitoring section 26 may be generated through configuration on the basis of the ordinary circuit data 28. Alternatively, the communication status monitoring section 26 may be formed as a separate circuit in the FPGA 16. In the former case, the establishment of communication is ascertained only after the circuit configuration is complete. As another alternative, the communication status monitoring section 26 may be provided as a circuit apart from the FPGA 16 in the auxiliary processing device 14. Whereas the foregoing description has focused on the FPGA as a typical PLD, the functional block of the circuit status monitoring section 24 may not be needed depending on the device type in use (e.g., CPLD). In such a case, the backup circuit data 30 is used where the communication is not established. That means the backup circuit data 30 may be composed of the settings designed solely to establish normal communication.

The above-described embodiment permits monitoring of whether communication is normally established when PLD logic circuits are to be configured on the basis of circuit data. If the communication is not established normally, the embodiment at least enables communication to be established using backup circuit data. Because the establishment of communication is guaranteed regardless of whether the intended logic circuits are configured, the embodiment ensures continuous access from an external computer. By monitoring two points, i.e., configuration of circuits and establishment of communication, the embodiment can record the occurrence of errors associated with each of these points. In subsequent corrective work, such records facilitate isolation of the cause of the malfunction.

Consequently, the system administrator need not visit the installation site and perform onsite corrective work such as removal of substrates for repair. The malfunction can be analyzed and the circuit data can be corrected accordingly on a remote basis. This feature is particularly effective in an environment where updates are frequently performed or where numerous devices are installed and interconnected to constitute a data center, for example. Because there is no need to install an ICE circuit in the form of substrates for direct access to the PLD, the costs of production of the entire system are lowered and the area to be occupied by substrates is reduced.

It is to be understood that while the present disclosure has been described in conjunction with a specific embodiment with reference to the accompanying drawings, it is evident that many alternatives, modifications and variations will become apparent to those skilled in the art in light of the foregoing description. It is thus intended that the present disclosure embrace all such alternatives, modifications and variations as fall within the spirit and scope of the appended claims.

The present technology contains subject matter related to that disclosed in Japanese Priority Patent Application JP 2015-092317 filed in the Japan Patent Office on Apr. 28, 2015, the entire content of which is hereby incorporated by reference.

What is claimed is:

1. A programmable device comprising:
   a circuit data setting section configured to set a logical configuration in a processing circuit using first setting information retrieved from a memory; and
   a communication status monitoring section configured to determine whether communication is established between the processing circuit and a host computer using the setting made by the circuit data setting section,
   wherein, if it is determined that the communication is not established, the circuit data setting section retrieves from the memory second setting information different from the first setting information to again set a logical configuration in the processing circuit on the basis of the second setting information.

2. The programmable device according to claim 1, further comprising a circuit status monitoring section configured to determine whether the setting based on the first setting information is complete,
   wherein, if it is determined that the setting based on the first setting information is not complete, the circuit data setting section also retrieves from the memory the second setting information different from the first setting information to again set a logical configuration in the processing circuit on the basis of the second setting information, and
   if it is determined that the setting based on the first setting information is complete, the communication status monitoring section determines whether the communication is established.

3. The programmable device according to claim 1, further comprising an interface that allows the first setting information to be updated by an external computer connected via the host computer.

4. The programmable device according to claim 3, wherein, if it is determined that the communication is not established, at least one of the circuit data setting section and the communication status monitoring section records the result of the determination to the memory accessible from the external computer.

5. An information processing device comprising:
   a programmable device configured to include a circuit data setting section setting a logical configuration in a processing circuit using first setting information retrieved from a memory; and
   a communication status monitoring section configured to determine whether communication is established between the processing circuit and a host computer using the setting made by the circuit data setting section,
   wherein, if it is determined that the communication is not established, the communication status monitoring section notifies the circuit data setting section of the result of the determination, and
   given the notification, the circuit data setting section retrieves from the memory second setting information different from the first setting information to again set a logical configuration in the processing circuit on the basis of the second setting information.

6. A control method for a processing circuit of a programmable device, the method comprising:
   setting a logical configuration in the processing circuit using first setting information retrieved from a memory;
   determining whether communication is established between the processing circuit and a host computer using the setting; and
   if it is determined that the communication is not established, then retrieving from the memory second setting information different from the first setting information to again set a logical configuration in the processing circuit on the basis of the second setting information.

* * * * *